United States Patent [19]
Sumida

[11] Patent Number: 5,485,023
[45] Date of Patent: Jan. 16, 1996

[54] INSULATED GATE BIPOLAR TRANSISTOR

[75] Inventor: Hitoshi Sumida, Kawasaki, Japan

[73] Assignee: Fuji Electric Co., Ltd., Kanagawa, Japan

[21] Appl. No.: 290,121

[22] Filed: Aug. 15, 1994

[30] Foreign Application Priority Data

Aug. 18, 1993 [JP] Japan .................................. 5-203509

[51] Int. Cl.[6] ........................... H01L 29/74; H01L 31/111
[52] U.S. Cl. .......................... 257/139; 257/140; 257/146; 257/141
[58] Field of Search ..................... 257/139, 140, 257/141, 343, 146, 142

[56] References Cited

U.S. PATENT DOCUMENTS

4,811,072  3/1989  Risberg .................................. 257/141

FOREIGN PATENT DOCUMENTS

0338312A2  10/1989  European Pat. Off. .

OTHER PUBLICATIONS

Application of General Purpose Power BiMOS Simulator TONADDEII to Double Gate Lateral Bipolar–Mode MOSFET Design, Nakagawa et al., Proceedings of 1988 International Symposium on Power Semiconductor Devices, pp. 42–47, Tokyo.

*Primary Examiner*—Wael M. Fahmy
*Attorney, Agent, or Firm*—Finnegan, Henderson, Farabow, Garrett & Dunner

[57] ABSTRACT

In a collector side portion of an insulated gate bipolar transistor, there are provided, for example, a p-type collector layer diffused into an n-type semiconductor region, an n-type carrier extraction layer diffused into the semiconductor region opposite to an emitter side portion and a field effect transistor portion having an auxiliary gate disposed between the collector layer and the carrier extraction layer. The field effect transistor portion is controlled by the auxiliary gate in such a manner that during its "off" state the collector layer is separated from the carrier extraction layer connected to a collector terminal to cause its potential to float so that the majority carriers flowing in a transverse direction below the collector layer prevent minority carriers from being injected from the collector layer into the semiconductor region, thereby shortening the "off" operation time.

4 Claims, 5 Drawing Sheets under the condition below 5,485,023

INSULATED GATE BIPOLAR TRANSISTOR

BACKGROUND OF THE INVENTION

The present invention relates to an insulated gate bipolar transistor (hereinafter referred to as IGBT) having a so-called lateral structure in which an emitter side portion and a collector side portion are formed in a semiconductor region such as an epitaxial layer on the surface side of a chip or wafer.

As well known, in its function, the IGBT is a lo combination of a field effect transistor provided with an insulated gate and a bipolar transistor. Specifically, the IGBT has both features of a high input impedance of the field effect transistor (FET) and a low output impedance of the bipolar transistor, and is suitable for a device for a high voltage and a large current. Therefore, the IGBT has been widely used as a discrete power device for driving several kinds of loads. Further, in recent years, there is a remarkable tendency that the IGBT is incorporated in an integrated circuit together with related circuits to rationalize the entire load driving apparatus and also high integration technology is used to miniaturize the pattern for forming the IGBT thereby to improve the high frequency performance. In this case, as a matter of course, it is advantageous to form the IGBT only from the surface of a wafer for an integrated circuit. For this reason, the IGBT having the above lateral structure is adopted. Now referring to FIG. 5, such a conventional lateral IGBT will be described briefly.

As in the case of an ordinary integrated circuit, a semiconductor base 10 which is a wafer or chip whose section is shown in FIG. 5, is composed of e.g., a p-type semiconductor substrate 11 and an n-type epitaxial layer as a semiconductor region 12 grown on the semiconductor substrate. IGBTs are formed by repeating the minute unit structure shown by "U" in the drawing plural times symmetrically in a horizontal direction in the semiconductor region 12. The left side of the drawing indicates an emitter side portion 20 and the right side portion indicates a collector portion 30. In the emitter side portion 20, from the surface of the semiconductor region 12, a p-type base layer 22, a p-type contact layer 23 inside it and n-type source regions 24 which partially overlap with the base region 22 and contact layer 23 are successively diffused, and a gate 21 is disposed through a very thin gate oxide film 21a on the surface of the base layer 22 which is located between the semiconductor region 12 and source layer 24. Further, an electrode film 41 is disposed so as to short-circuit the contact layer 23 with the source layers 24 on the surface of the substrate. An emitter terminal E for the IGBT is drawn from the electrode film 41, and a gate terminal G is drawn from the portion other than the shown section of the gate 21.

The collector side portion 30 is composed of a p-type collector layer 33 diffused from the surface of the semiconductor region 12 spaced apart from the emitter side portion 20 by a predetermined distance, an electrode film 42 connected to the collector layer 33 and a collector terminal C drawn from the film 42. In this example, an n-type buffer layer 13 is formed so as to surround the collector layer 33 externally. Plural unit structures U as shown in FIG. 5 are formed and emitter side portion 20 and collector side portion 30 are connected in parallel to form the IGBT which is used with a positive voltage applied to the collector terminal C.

In this example, when a positive control voltage relative to the emitter terminal E is applied to the gate terminal G of the IGBT, an n-type channel is formed in the surface portion of the base layer 22 below the gate 21. Through the n-type channel, majority carriers which are electrons are injected from the source layer 24 into the semiconductor region 12. Thus, a p-n-p type bipolar transistor composed of the p-type collector layer 33, n-type semiconductor region 12 and the p-type base layer 22 or contact layer 23 receives the majority carriers as a base current so that it turns on so as to be electrically conductive between the emitter terminal E and collector terminal C. Further, when the current due to the majority carriers flows into the collector layer 33 owing to the turn-on of the p-n-p type transistor, the minority carriers which are holes in this example are injected into the semiconductor layer 12 through the buffer layer 13 from the collector layer 33. Their mutual action with the majority carriers generates so-called conductivity modulation action in the semiconductor region 12. Thus, the conductivity of the semiconductor region 12 is enhanced thereby to increase the current capacity of the IGBT.

When the control voltage for the gate terminal G is cut off, the channel below the gate 21 disappears. Therefore, the injection of the majority carriers into the semiconductor region 12 is stopped so that the IGBT turns off. During the "off" operation, the majority carriers remaining in the semiconductor region 12 are pulled out into the collector terminal C through the collector layer 33 and the minority carriers remaining in the semiconductor region 12 are pulled out into the emitter terminal E through the base layer 22 and contact layer 23. Thus, as these carriers are swept out from the semiconductor region 12, a depletion layer is enlarged within the semiconductor region 12. This results in the off state with a predetermined withstand voltage in accordance with the distance between the emitter side portion 20 and collector side portion 30.

The time required for such an "off" operation is substantially determined by the time required to sweep the holes or minority carriers with a lower mobility. When a large amount of minority carriers are injected into the semiconductor region 12 while the majority carriers are extracted, the "off" operation is prolonged. In order to obviate such an inconvenience, as described above, the buffer layer 13 having the opposite n-type conductivity type and surrounding the collector layer 33 is provided to restrain the injection of minority carriers thereby to shorten the "off" operation.

Although the IGBT described above has advantages of a high input impedance equivalent to the field effect transistor and a low output impedance or "on" voltage substantially equivalent to a bipolar transistor, it is difficult to increase the "off" operation speed. Therefore, the above IGBT is not suitable for application to a circuit operating at a high frequency. The above buffer layer 13 can increase the "off" operation speed slightly. However, the increase of such an effect decreases the number of minority carriers injected in the semiconductor region 12 when the IGBT is "on" so that the conductivity modulation action can be attenuated. Thus, the unique feature of the IGBT having a low "on" voltage will be lost.

In order to obviate this difficulty, in the IGBT for a high frequency, a process has been frequently adopted in which the trap level having the same function as that of lifetime killers is formed in the semiconductor region 12 by the means such as electron beam radiation so that the minority carriers are absorbed by recombination. But, since this operation acts not only during the "off" operation but also during the "on" state, the "on" voltage is necessarily increased more or less. In addition, where the IGBT is formed into an integrated circuit device, the entire chip will be subjected to electron beam radiation. As a result, the threshold voltage of the relevant circuits will be reduced disadvantageously.

A so-called "collector-shorted structure" has been proposed as powerful means for solving the above problem. Now referring to FIG. 6, this collector-shorted structure will be explained. As shown in FIG. 6, a p-type collector layer 33 and an n-type collector short layer 36 whose periphery is encircled by the collector layer are diffused into the collector side portion 30, and a collector terminal C is formed on an electrode film 42 which short-circuits both layers 33 and 36. The emitter side portion 20 has the same structure as shown in FIG. 5. When the IGBT is in an "on" state, a part of majority carriers injected from the emitter side portion 20 into the semiconductor region 12 flows into the collector short layer 36 through a portion below the collector layer 33 and the remaining part of the majority carriers flows into the collector layer 33. Then, the minority carriers flow from the p-type collector layer 33 into the semiconductor region 12.

When the IGBT is in the off operation, minority carriers are hard to be generated against the majority carriers flowing into the collector short layer 36. Thus, the collector-shorted structure can reduce the number of minority carriers to be swept from the semiconductor region 12 thereby to shorten the "off" operation time. In the case of the lateral IGBT, however, the majority carriers flowing into the collector short layer 36 pass the lower side of the collector layer 33. Therefore, a remarkable amount of minority carriers are likely to be injected from the collector layer 33 into the semiconductor region 12. As a result, the "off" operation time in the lateral structure cannot be shorten as that in the vertical structure.

SUMMARY OF THE INVENTION

An object of the present invention is to solve the above problem to increase the "off" operation speed of an IGBT having a lateral structure.

In accordance with the present invention, the above object can be attained by a lateral IGBT, wherein a main gate located on the emitter side portion controls the injection of majority carriers into the semiconductor region; a collector side portion comprises a collector layer with a second conductivity type diffused into the semiconductor region having a first conductivity type, a carrier extraction layer with the first conductivity type diffused into the semiconductor region opposite to an emitter side portion, a field effect transistor portion having an auxiliary gate disposed between the collector layer and the carrier extraction layer, and a collector terminal is extracted from the carrier extraction layer. The field effect transistor portion at the collector side portion is controlled by the auxiliary gate in such a manner that during its "on" state where the collector layer is connected to the carrier extraction layer, majority carriers are caused to flow from the semiconductor region to the carrier extraction layer and minority carriers are injected from the collector layer into the semiconductor layer, and during its "off" state where the collector layer is separated from the carrier extraction layer, the majority carriers and minority carriers are extracted from the semiconductor region into the carrier extraction layer and the emitter side portion, respectively.

In the IGBT according to the present invention also, in the emitter side portion, for example, as in the prior art, from the surface of the semiconductor region having the first conductivity type, a base layer having the second conductivity type, a contact layer having the second conductivity type inside the base layer and source regions having the first conductivity type which partially overlap with the base region and contact layer, are successively diffused, and an insulated gate as a main gate is disposed on the surface of the base layer which is located between the semiconductor region and source layer. Further, an electrode film from which an emitter electrode is extracted is disposed so as to short-circuit the emitter layer with the source layer.

The above field effect transistor portion in the collector side portion preferably comprises a well diffused with the second conductivity type so that it is connected to the same potential as that of the collector layer, a source layer having the first conductivity type diffused on the surface of the well and collector layer in a pattern partially overlapping with the well and collector layer and the auxiliary gate disposed so as to cover the surface of the well sandwiched by the source layer and the carrier extraction layer, and the surfaces of the collector layer and source layer is preferably short-circuited to each other by an electrode film on the surface. Further, it is desired that in the semiconductor region abutting on the periphery of the collector side portion, a buffer layer having the same conductivity type as that of the semiconductor region is diffused to control the injection amount of the minority carriers for the semiconductor layer.

In fabricating the IGBT having a structure in which the base layer, contact layer and source layer are provided in the emitter side portion whereas the well, collector layer, source layer, carrier injection layer are provided in the collector side portion, it is advantageous that the base layer and well having the second conductivity type, the contact layer and collector layer having the second conductivity type, and the source layer in the emitter side portion, the source layer and carrier extraction layer in the collector side potion having the first conductivity type are diffused simultaneously, respectively thereby to reduce the number of fabrication steps.

The IGBT according to the present invention is on-off operated in such a manner that the main gate and auxiliary gate are simultaneously controlled. In this case, the auxiliary gate is preferably controlled slightly before (e.g., a short time of 1 µs or less) the main gate is. Further, preferably, the main gate is controlled by the control voltage of a main gate operating power source on an emitter side potential and the auxiliary gate is controlled by the control voltage of an auxiliary gate operating power source on a collector side potential, and the state of the control voltage for one of the main gate and the auxiliary gate is transferred to that of the control voltage for the other so that the main gate and the auxiliary gate are controlled correlatively to each other.

The IGBT according to the present invention operates in such a manner that during an "off" operation, the collector layer is separated from the collector terminal so that the minority carries are not injected into the semiconductor region in accordance with the majority carriers flowing into the collector layer while the majority carriers are directly extracted through the carrier extraction layer toward the collector terminal thereby to shorten the "off" operation time as compared with the prior art.

Specifically, according to the structure of the present invention described above, in the collector side portion of the IGBT, a collector layer, a carrier extraction layer on opposite to the emitter side portion and a field effect transistor portion having an auxiliary gate disposed between the collector layer and the carrier extraction layer are disposed so that a collector terminal is extracted from the carrier extraction layer, the field effect transistor portion is controlled by the auxiliary gate in such a manner that during its "on" state where the collector layer is connected to the carrier extraction layer, the conductivity modulation operation by the minority carriers injected in the semiconductor layer from the collector layer when the majority carriers flow into the carrier extraction layer is used to reduce the on-voltage of the IGBT, and during its "off" state where the collector layer is separated from the carrier extraction layer, the minority carriers for the semiconductor region are not generated while carriers are extracted from the semiconductor region, thereby shortening the "off" operation time.

Thus, in accordance with the IGBT according to the present invention, the "off" operation time can be shortened without introducing lifetime killers unlike the prior art. Particularly, where the IGBT(s) is incorporated in an integrated circuit device, a bad influence of the lifetime killers on the operation characteristic of the related circuits can be eliminated. Further, while the conventional collector-shorted structure cannot prevent minority carriers from being injected into the semiconductor region during the "off" operation, the present invention can completely prevent the injection of minority carriers during the "off" operation by separating the collector layer, which is a carrier generating source, from a collector potential so that the "off" operation time can be shortened as compared with the prior art.

BRIEF DESCRIPTION OF THE DRAWINGS

FIGS. 1 (a) to (c) show an embodiment of the IGBT according to the present invention, in which

FIGS. 2 (a) to FIG. 2 (f) are enlarged sectional views showing the main part corresponding to the semiconductor region of a wafer shown in FIG. 1(a) in the respective states after main steps in fabricating the IGBT according to the present invention, in which

FIGS. 4(a) to 4(g) show an example of application of the IGBT according to the present invention to a three-phase circuit, in which FIG. 4(a) is a circuit diagram related to gate driving, FIG. 4(b) shows an on-off waveform of the upper IGBT for a U-phase, FIG. 4(c) shows an on-off waveform of the lower IGBT for a U-phase, FIG. 4(d) shows an on-off waveform of the upper IGBT for a V-phase, FIG. 4(e) shows an on-off waveform of the lower IGBT for a V-phase, FIG. 4(f) shows an on-off waveform of the upper IGBT for a W-phase, and FIG. 4(g) shows an on-off waveform of the lower IGBT for a W-phase;

DETAILED DESCRIPTION OF THE PREFERRED EMBODIMENTS

Figure 1A:
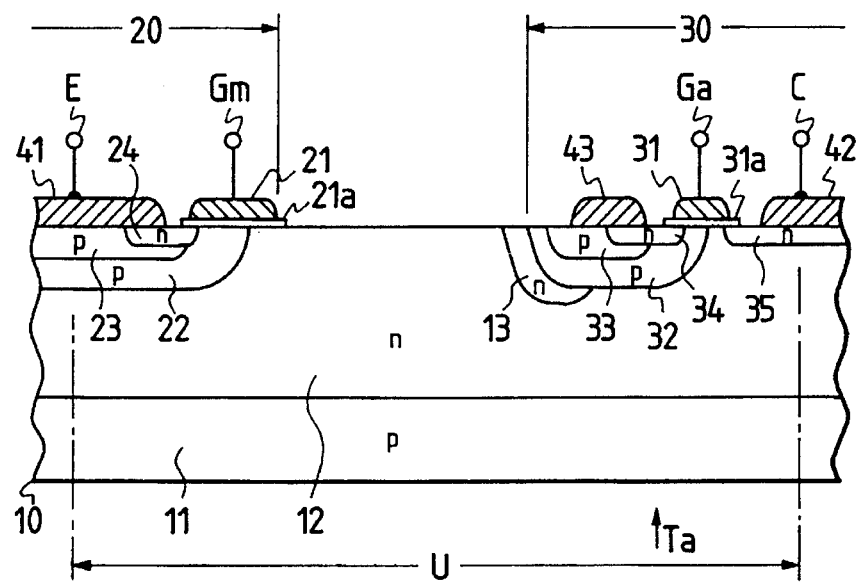
FIG. 1(a) is a main-portion enlarged sectional view showing a unit structure of the IGBT.
Figure 1B:
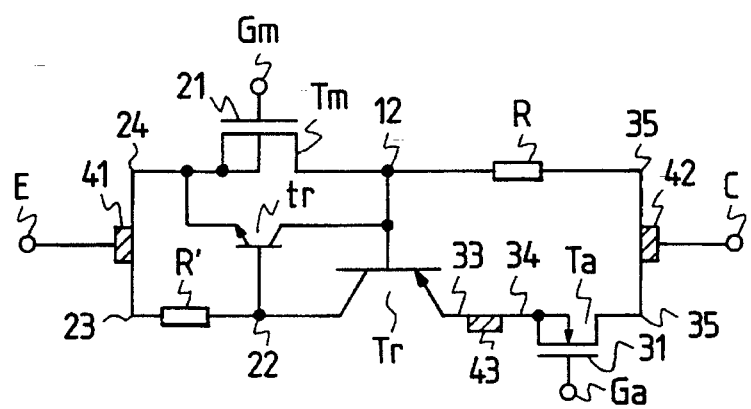
FIG. 1(b) is an equivalent circuit diagram of the unit structure.
Figure 1C:
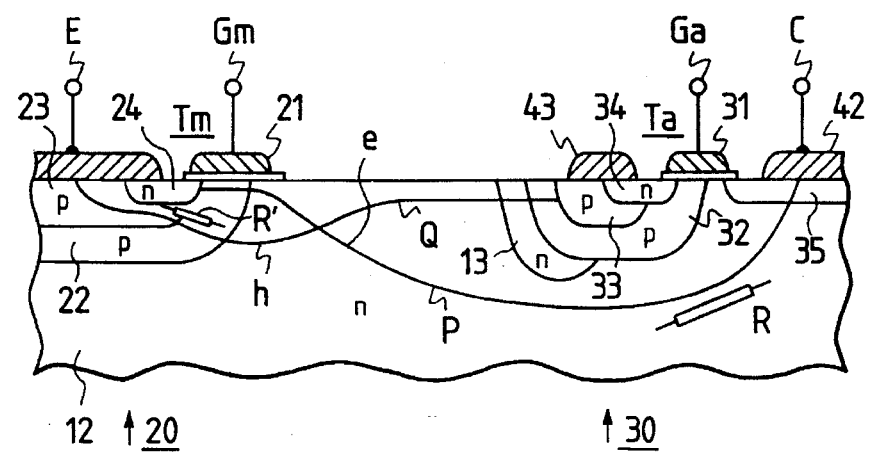
FIG. 1(c) is a sectional view corresponding to FIG. 1(a) which shows the manner of carrier flow within the IGBT.

Referring to the accompanying drawings, the preferred embodiments of the present invention will now be described. FIGS. 1(a) to 1(c) illustrate a structure of the IGBT according to the present invention, an equivalent circuit and the flow of carriers, respectively. FIGS. 2(a) to 2(f) show main steps for fabricating the IGBT. FIG. 3 shows a circuit suitable to control the main gate and the auxiliary gate of the IGBT. FIGS. 4(a) to 4(g) illustrate a gate control circuit when the IGBT is applied to a three-phase circuit and the manner of control, respectively. Since reference numerals in FIGS. 1 and 2 similar to those in FIGS. 5 and 6 previously explained indicate like parts, an explanation for the common parts will not be given at discretion.

Figure 5:
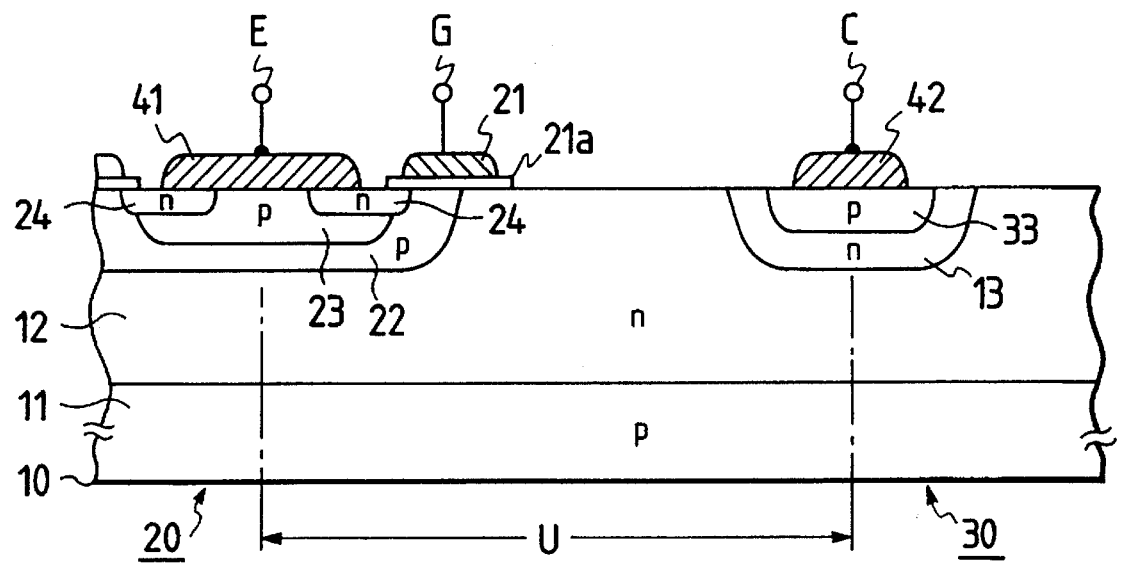
FIG. 5 is a sectional view showing the unit structure of the conventional IGBT.

FIG. 1(a) shows the unit structure U of the IGBT according to the present invention in its section. A semiconductor base 10, like the prior art shown in FIG. 5, is composed of a p-type semiconductor substrate 11 and an n-type layer epitaxially grown as a semiconductor region 12 on the semiconductor substrate. The semiconductor base 10 may be a "substrate joining type" in which an n-type semiconductor substrate as the semiconductor region 12 is joined with the substrate 11 through a silicon oxide film at a high temperature. Although the structure of an emitter side portion 20 on the left side in FIG. 1 is the same as that of FIG. 5, in accordance with the present invention, a main control terminal Gm is extracted as a main gate 21 which is the gate for the emitter side portion 20. A collector side portion 30 on the right side, unlike the prior art, has a structure in which a field effect transistor portion Ta is formed between a p-type collector layer 33 and an n-type carrier extraction layer 35.

In the illustrated example, the field effect transistor Ta includes a p-type well 32 which externally surrounds a collector layer 33, an n-type source layer 34 diffused in a pattern partially overlapping with the well 32 and collector layer 33 and an auxiliary gate 31 disposed through a gate oxide film 31a on the surface of the well 32 between the source layer 34 and the carrier extraction layer 35. The source layer 34 is short-circuited with the collector layer 33 by an electrode film 43 on the surface. Further, in the IGBT according to the present invention, as shown, a collector terminal C is drawn out from the electrode film 42 connected to the carrier extraction layer 35 and an auxiliary control gate Ga is drawn out from the auxiliary gate 31.

In the IGBT thus constructed, the field effect transistor Ta which is formed in the surface of the well 32 below the auxiliary gate 31 serves to connect the collector layer 33 to the carrier extraction layer 35 during an "on" operation and to separate the former from the latter during an "off" operation. The electrode film 43 serves to convert n-type carriers in the source layer 34 into p-type carriers in the collector layer 33. The gate length of the auxiliary gate 31 in an illustrated horizontal direction may be about half or less as long as that of the main gate 21. In the illustrated example, although the surface of the semiconductor region 12 remains slightly between the well 32 and the carrier extraction layer 35 below the auxiliary gate 31, this does not hinder a channel of the field effect transistor Ta from being formed. As necessity requires, the diffusion length of the well 32 and carrier extraction layer 35 in a horizontal direction can be extended to remove the remaining surface. Further, the well 32 is not required to surround the entire collector 33 as shown, but may surround only the right half of the illustrated portion. Also, it is desired to diffuse previously a relatively deep n-type buffer layer 13 into a portion of the semiconductor region 12 abutting on the periphery of the collector side portion 30.

FIG. 1(b) shows an equivalent circuit of the IGBT according to the present invention. Reference symbols in FIG. 1(b) similar to those in FIG. 1(a) indicate like elements. The transistor Tr shown at a center position in FIG. 1(b) is a p-n-p type bipolar transistor composed of the p-type base layer 22, n-type semiconductor layer 12 and p-type collector layer 33. Its collector side is connected to the emitter terminal E while its emitter side is connected to the collector terminal C through the above field effect transistor portion Ta. During the "on" time, the n-channel type field effect transistor Tm provided with the main gate 21 injects the majority carriers from the source layer 24 into the bipolar transistor Tr as a base current. Incidentally, the n-p-n type parasitic transistor tr indicated by a fine line is related with the latch-up phenomenon of the IGBT. When the lateral resistance R' of the base layer 22 and contact layer 23 immediately below the n-type source layer is large, the n-p-n parasitic transistor tr may operate to break the device.

In the embodiment illustrated, the IGBT having the above equivalent circuit is used in such a manner that the field effect transistors Tm and Ta are simultaneously turned on or off with a positive bias voltage applied to the collector terminal C. When the IGBT is "on", the emitter of the bipolar transistor Tr is connected to the collector terminal C through the field effect transistor Ta. In contrast, when the IGBT is "off", the field effect transistor Ta is turned off to separate the emitter of the bipolar transistor Tr from the collector terminal C. In order to speed up the "off" operation of the IGBT to the utmost, it is most desirable that the auxiliary transistor Ta is turned off precedently by a very short time of about 1 μsec or less to the main transistor portion Tm.

Now referring to FIG. 1(c) showing the flow paths of carriers, the operation of the IGBT according to the present invention will be described concretely. When the IGBT is made turned on, predetermined voltages are applied to the main control terminal Gm and the auxiliary control terminal Ga to turn on the FET portions Tm and Ta so that in the collector side portion 30, the collector layer 33 is connected to the carrier extraction layer 35 at the same potential through the FET portion Ta. When the FET portion Tm turns on, in the emitter side portion 20, the majority carriers e or electrons are injected from the source layer 24 into the semiconductor region 12 through the channel below the main gate 21 and flow into the carrier extraction layer 35 through the flow path P as shown.

The flow path P in the semiconductor region 12 has resistance R. Owing to the voltage drop due to the resistance, the potential at the semiconductor region below the collector layer 33 and the well 32, which is connected to the same potential as the carrier extraction layer 35 by the on of the transistor Ta, is reduced. Thus, the p-n junction between the well 32 and the semiconductor region 12 is forward-biased so that holes or minority carries h are injected into the semiconductor region 12 from the collector layer 33. As a result, the bipolar transistor Tr shown in FIG. 1(b) turns on. Then, as shown in FIG. 1(c), the minority carriers h flow from the collector layer 33 through the buffer layer 13 into the semiconductor region 12, and further passes through the flow path Q to flow into the contact layer 23 through the base layer 22 in the emitter side portion 20. During this "on" state, conductivity modulation occurs between the majority carriers e and the minority carriers h within the semiconductor region 12 so that a relatively low "on" voltage permits conduction to occur between the emitter terminal E and the collector terminal C.

In order to turn off the IGBT, the control voltages for the main control terminal Gm and auxiliary control terminal Ga are caused to disappear so as to turn off the FET portions Tm and Ta. Thus, the injection of majority carriers e from the emitter side portion 20 into the semiconductor region 12 stops. Then, the majority carriers remaining within the semiconductor region 12 are drawn by the carrier extraction layer 35. In this case, since the FET portion Ta is "off", the collector layer 33 and well 32 are separated from the carrier extraction layer 35 so as to be in a floating potential state. Therefore, the p-n junction between the well 32 and semiconductor region 12 is not forward-biased despite the voltage drop due to the majority carriers e flowing through the resistance R in the semiconductor region 12. Thus, the injection of the minority carriers into the semiconductor region 12 stops completely. In this way, in the IGBT according to the present invention, the minority carriers are not injected into the semiconductor region 12 on the way of the "off" operation so that only the minority carriers remaining within the semiconductor region 12 at the initial time of the "off" operation have to be drawn or swept toward the contact layer 23. For this reason, the time required for the "off" operation can be shortened to about half as long as in the prior art.

Figure 6:
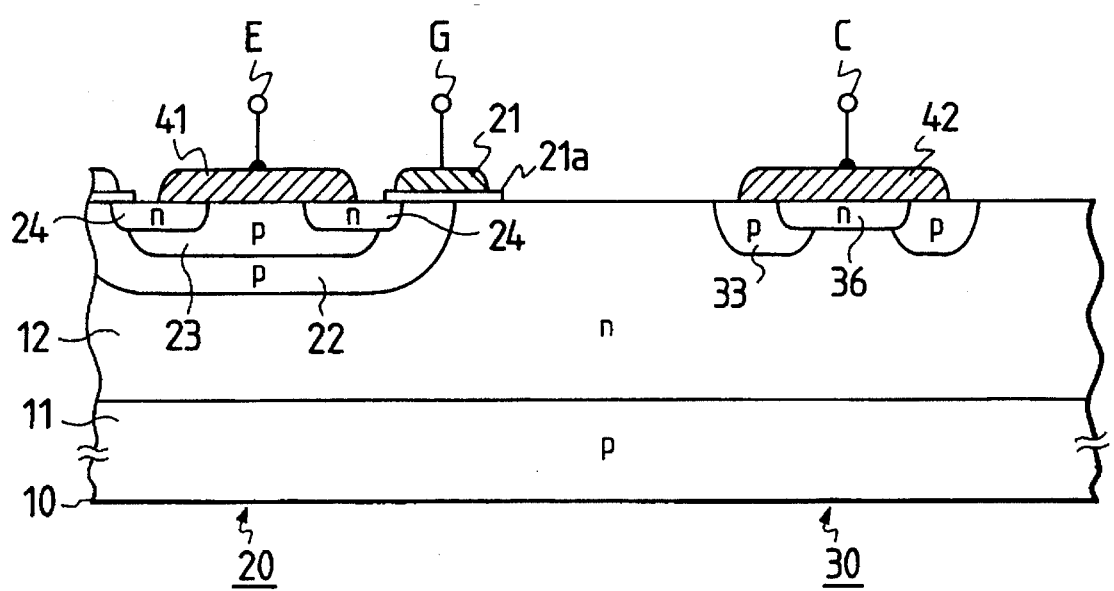
FIG. 6 is a sectional view showing the unit structure of the conventional IGBT having a collector-shorted structure.

As described above, the IGBT according to the present invention can sufficiently shorten the "off" operation time and is not required to introduce lifetime killers unlike the prior art. Therefore, when the IGBT as well as its related circuits is incorporated into an integrated circuit device, the related circuits can exhibit an operation performance without being influenced by the lifetime killers. Further, in the prior art collector-shorted circuit as shown in FIG. 6, when the majority carriers flowing toward the collector short layer 36 during the "off" operation flow on the lower side of the collector layer 33, the p-n junction between the collector layer 33 and semiconductor layer 12 is forward-biased owing to the voltage drop due to the resistance R in the semiconductor region 12, and the flow of the majority carriers into the collector layer 33 remains at the initial time of the "off" operation. For these reasons, the injection of minority carriers from the collector layer 33 is inevitable. On the other hand, in the present invention, during the "off" operation, the collector layer 33 is in a floating potential state so that the p-n junction will be never forward-biased. In the present invention also, in the complete "on" state, the majority carriers can flow into the collector layer 33. But this is not problematic because the collector layer 33 is separated from the carrier injection layer 35 at the initial time of the "off" operation.

Figure 2A:
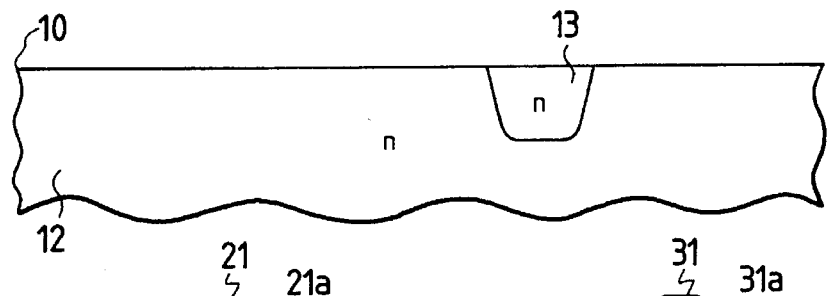
FIG. 2(a) shows the step of diffusing a buffer layer.
Figure 2B:
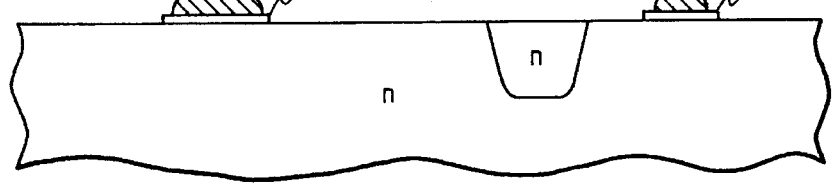
FIG. 2(b) shows the step of disposing a main gate and an auxiliary gate.

With reference to FIGS. 2(a) to 2(f), the main steps for fabricating the IGBT having such a structure as shown in FIG. 1(a), will be described. Since the IGBT of FIG. 1(a) has the buffer layer 13, in the first step of FIG. 2(a), it is formed with the same n-type as that of the semiconductor region 12 from the surface of the semiconductor region 12. For this purpose, phosphorus (P) is ion-injected at a dosage of $10^{12}$–$10^{13}$ atoms/cm² from the window of a photoresist film applied to the surface of the semiconductor region 12, and thermally diffused so that the buffer layer 13 having a depth of 5–6 μm is formed into the semiconductor region 12. FIG. 2(b) shows a gate providing step. The surface of the semiconductor region 12 is thermally oxidized to form a thin gate oxide film. By the CVD method, polysilicon is deposited to have a thickness of about 0.5 μm. The deposited polysilicon is photo-etched to form the main gate 21 and auxiliary gate 31 at predetermined positions as shown.

Figure 2C:
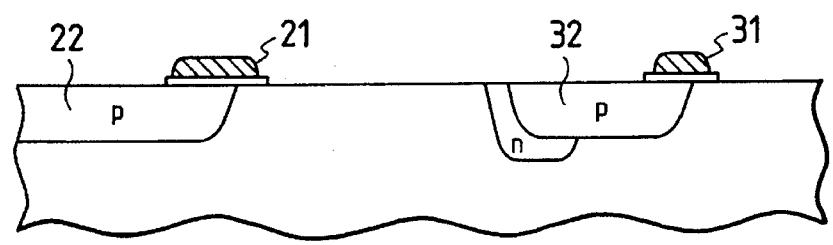
FIG. 2(c) shows the step of simultaneously diffusing a base layer and a well.
Figure 2D:
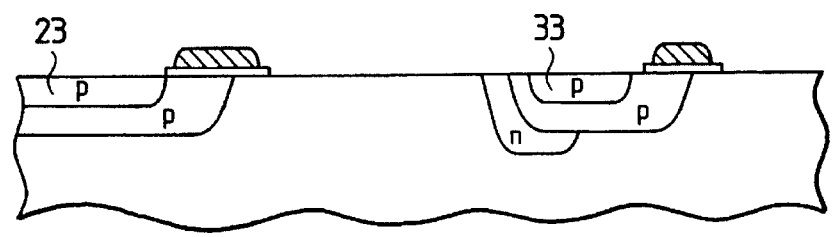
FIG. 2(d) shows the step of simultaneously diffusing an emitter layer and a collector layer.
Figure 3:
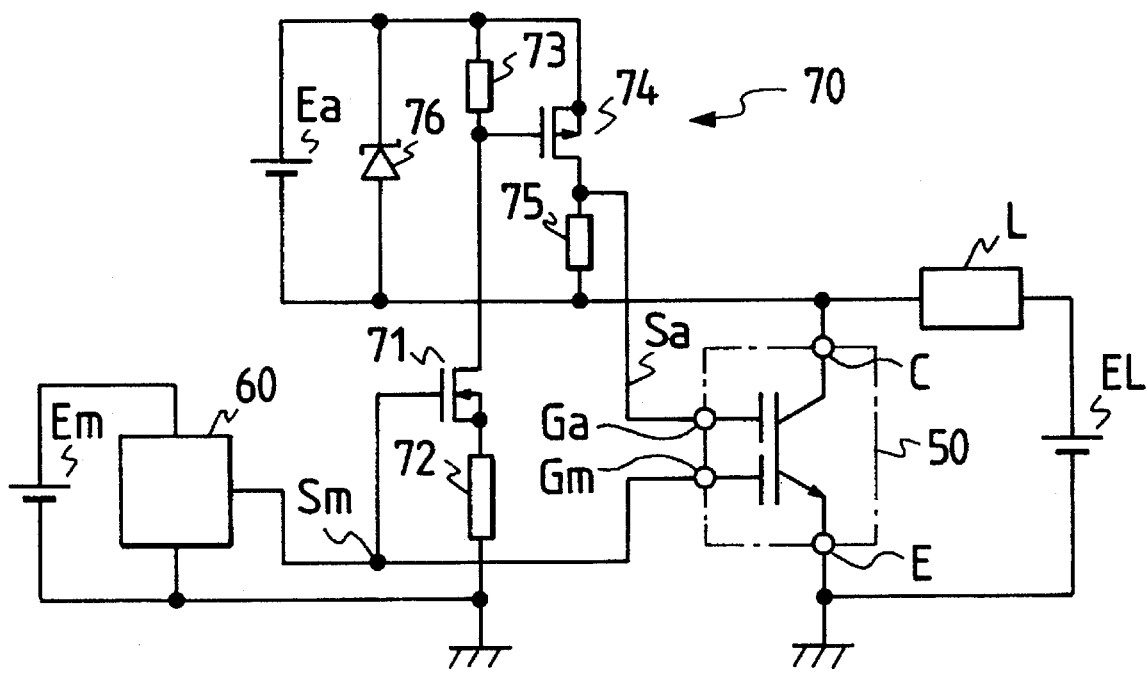
FIG. 3 is a circuit diagram related to gate driving of the IGBT according to the present invention.

FIG. 2(c) shows a simultaneous diffusion step of the p-type base layer 22 and well 32. Using as a part of a mask the main gate 21 and auxiliary gate 31, boron (B) is ion-injected at a dosage of about $10^{14}$ atoms/cm$^2$ and thermally diffused so that the base layer 22 and well 32 are formed into the semiconductor region 12 to have a depth of 3–4 μm and to intrude into the region under the main gate 21 and auxiliary gate 31. The next step, FIG. 2(d) shows a simultaneous diffusion-step of the p-type contact layer 23 and collector layer 33. As in the step of FIG. 2(c), boron is ion-injected at a dosage of about $10^{15}$ atoms/cm$^2$ and thermally diffused so that the contact layer 23 and the collector layer 33 are formed to have a depth of 1–2 μm.

Figure 2E:
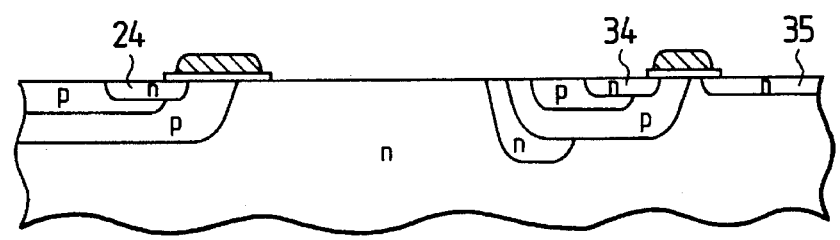
FIG. 2(e) shows the step of simultaneously diffusing source layers and a carrier extraction layer.
Figure 2F:
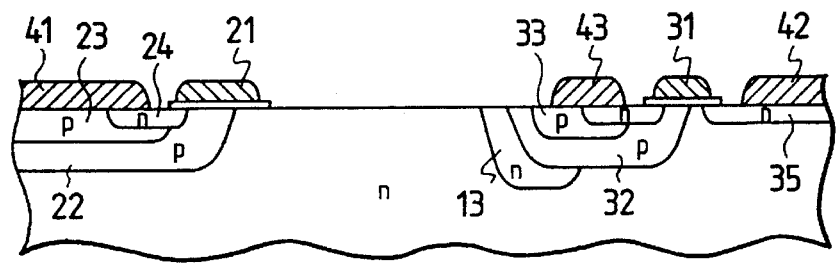
FIG. 2(f) shows the step of disposing electrode films.

FIG. 2(e) shows a simultaneous diffusion step of the source layer 24 in the emitter side portion 20 and the source layer 34 and carrier extraction layer 35 in the collector side portion 30. Using as a part of a mask the main gate 21 and auxiliary gate 31, e.g., arsenic is ion-injected at a dosage of $10^{15}$ atoms/cm$^2$ and thermally diffused so that both source layers 24 and 34 and carrier extraction layer 35 are formed to have a depth of 0.1–0.5 μm and slightly intrude into the region under the main gate 21 and auxiliary gate 31. It should be noted that the boron in the previous step of FIG. 2(d) and arsenic in this step of FIG. 2(e) can be diffused simultaneously.

Thus, the semiconductor layers are completed. In the final step of FIG. 2(f), an electrode film is disposed. The electrode film is made of aluminum containing silicon. The electrode film is formed to have a thickness of about 2 μm and photo-etched to dispose in the emitter side portion 20 the electrode film 41 which short-circuits the contact layer 23 and source layer 24 on the substrate surface and to dispose in the collector side portion 30 the electrode film 42 connected to the carrier extraction layer 35 and the electrode film 43 which short-circuits the collector layer 33 and source layer 34 on the substrate surface. Thus, the IGBT structure as shown in FIG. 1(a) is completed. Like the example of the steps of FIGS. 2(a) to 2(f), in fabricating the IGBT according to the present invention, it is very advantageous to form the corresponding insulated gates, corresponding semiconductor layers (except for the buffer layer) and corresponding electrode films in the emitter side portion 20 and collector side portion 30 in the common step.

Finally, referring to FIGS. 3 and 4, the circuit suitable for driving the main gate and auxiliary gate of the IGBT according to the present invention will be described. In these figures, the IGBT 50 according to the present invention is shown as a bipolar transistor provided with two insulated gates which is encircled by a one-dot chain line. The IGBT 50 shown in FIG. 3 is used in a state where the emitter terminal E is connected to ground and the collector terminal C is supplied with the voltage from a load power source EL through a load L. The main control terminal Gm and auxiliary control terminal Ga must control the emitter terminal E and the collector terminal C as a reference potential point, respectively. For this purpose, a main gate operating power source Em is provided on a ground side while an auxiliary gate operating power source Ea is provided on the high voltage side of the load power source EL. In the illustrated example, a control circuit 60 shown at a lower left position in FIG. 3, which is supplied with power from the main gate operating power source, Em, applies a control voltage Sm to the main control terminal Gm of the IGBT 50. A level shift circuit 70 shown at a center portion in FIG. 3 serves to apply the voltage, in accordance with the state of the control signal Sm, from the auxiliary gate operating power source Ea to the auxiliary control terminal Ga as a control voltage Sa the reference potential for which is that at the collector terminal C of the IGBT 50.

In the illustrated example, the level shift circuit 70 is composed of FETs and resistors. When an FET 71 turns on in response to the control voltage Sm for the main control gate terminal Gm, it turns on an FET 74 through resistors 72 and 73 so that the voltage of the auxiliary operating power source Ea is derived from the FET 74. The voltage is outputted as the control voltage Sa for the auxiliary control terminal Ga. Incidentally, the resistor 72 is a resistor for level shift and the resistor 73 is a resistor for operating the gate of the FET 74. In the illustrated example, a Zener diode 76 is connected to the auxiliary gate operating power source Ea of the level shift circuit 70. This Zener diode 76 serves to prevent an excess voltage from being applied to the auxiliary control terminal Ga when the potential at the collector terminal C of the IGBT 50 is greatly varied in accordance with the state of the load L.

As understood from the above description, the gate driving circuit shown in FIG. 3 can control both control terminals Gm and Ga correlatively with each other while the state of the control voltage Sm for the main control terminal Gm of the IGBT 50 is transferred to the state of the control voltage Sa for the auxiliary control terminal Ga through the level shift circuit 70. But, in the illustrated circuit, the state of the control voltage Sa for the auxiliary control terminal Ga changes slightly later than that of the control voltage Sm for the main control terminal Gm by the operation time of the level shift circuit 70 even if it is small. When it is desired or necessary that the former changes earlier than the latter, the portion other than the Zener diode 76 of the level shift circuit 70 shown in FIG. 3 is connected reversely in a vertical direction and the channel type of each of the FETs 71 and 74 is inverted. In this way, the state of the control voltage Sa can be transferred to the control voltage Sm for the main control terminal Gm while the auxiliary control terminal Ga is controlled by the control voltage Sa through the driving circuit 60.

Figure 4A:
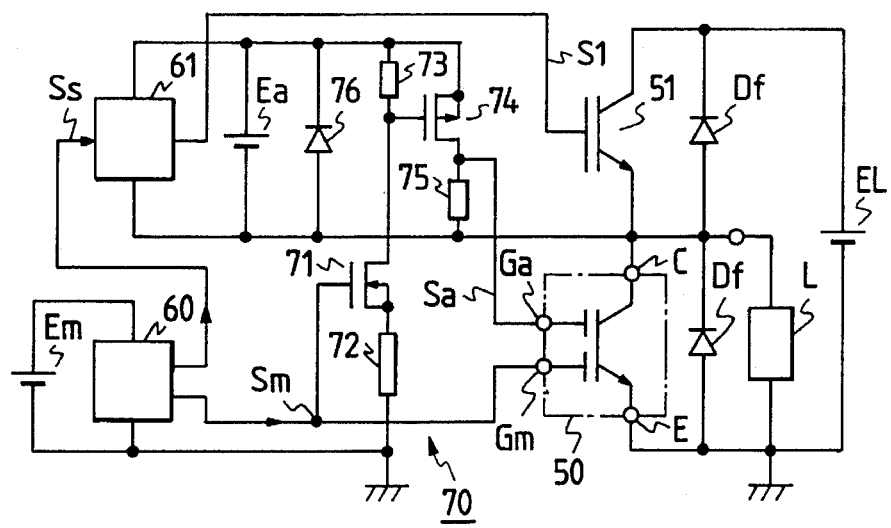
Figure 4B:
Figure 4C:
Figure 4D:
Figure 4E:
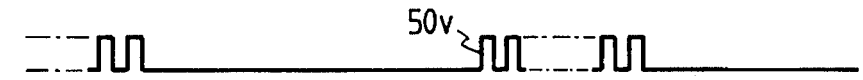
Figure 4F:
Figure 4G:

FIG. 4(a) shows an example of a circuit for one phase when the IGBT according to the present invention is applied to a three-phase load circuit such as a motor. In this application example, two IGBTs 50 and 51 in an inverter connection are used to provide a load power source EL for driving the load L corresponding to one phase. The IGBTs 50 and 51 are on-off controlled to drive the load L in each phase as shown in FIG. 4(b) et seq. As usual, diodes Df for free wheeling are connected in parallel to each of the IGBTs 50 and 51. In FIGS. 4(b) to 4(g), the on/off waveforms of the IGBTs 50 and 51 which drive the load L of each of UVW three phases are illustrated by 50u, 50v and 50w and 51u, 51v and 51w. As seen from the waveforms shown in the figures, the IGBT 51 at the upper part of FIG. 4(a) is subjected to simple on/off control whereas the IGBT 50 at the lower part is subjected to high-frequency fine on/off control like the chopper control for PWM controlling the current flowing through the load L.

In the illustrated circuit as shown in FIG. 4(a), the conventional Single-gate IGBT is used as the upper IGBT 51 whereas the dual gate IGBT according to the present invention which is suited for a high frequency because of its high speed "off" operation is used as the lower IGBT 50. When the on/off frequency of the IGBT 51 is 1 Khz, the chopping frequency of the IGBT 50 according to the present invention is set to about 20 kHz. The circuit related to the IGBT 50 in FIG. 4(a) has the same structure as in FIG. 3. In the illustrated circuit configuration, the driving circuit 60 includes a PWM control circuit, which generates the control voltage Sm for the main control terminal Gm of the IGBT 50 to have, e.g., the same on/off waveform 50u shown in FIG. 4(c). In response to the control voltage Sm, the level shift circuit 70 supplies the control voltage Sa having the same waveform as that of Sm to the auxiliary control terminal Ga at the voltage of the auxiliary gate operating power source Ea.

Another driving circuit 61 is provided for the IGBT 51. In the illustrated circuit configuration, the auxiliary gate operating power source Ea is used as a power source for the driving circuit 61. In response to a synchronizing signal Ss from the driving circuit 60 for the IGBT 50, the driving circuit 61 supplies a control signal S1 having, e.g., the same waveform as the on/off waveform 51u shown in FIG. 4(b) to the gate of the IGBT 51 at the voltage of the auxiliary gate operating power source Ea. Thus, in the circuit configuration of FIG. 4(a), the auxiliary gate operating power source Ea for the IGBT 50 can be also used to drive the gate of the IGBT 51. Further, the IGBT 50 can be chopper-controlled at a high frequency so that the current flowing through the load L is precisely PWM-controlled to enhance the control performance. In addition, a waste current can be prevented from flowing, thus reducing power consumption.

Incidentally, circuits for, e.g., three phases each corresponding to the circuit for one phase shown in FIG. 4(a) except for the load and power source are incorporated in a single semiconductor integrated circuit chip. In this case, the semiconductor region 12 must be separated for each phase. Therefore, it is advantageous to use, as the semiconductor base 10 in FIG. 1(a), the above mentioned substrate joining type wafer in place of the junction separation type wafer shown in the figure. In this way, without being limited to the illustrated embodiments, the present invention can be put into practice in concrete structures or manners in accordance with uses or situations.

As described above, in the present invention, in the collector side portion, the collector layer, carrier extraction layer and the field effect transistor portion connecting or separating both are provided. The field effect transistor portion is controlled by the auxiliary gate in such a manner that during its "on" state where the collector layer is connected to the carrier extraction layer, minority carriers are injected from the collector layer into the semiconductor layer, and during its "off" state where the collector layer is separated from the carrier extraction layer, the carriers are swept away from the semiconductor region. Thus, the following effects can be obtained.

(a) Even when the majority carriers flow into the semiconductor region on the lower side of the collector layer in a transverse direction during the "off" operation, since the collector layer is separated from the carrier extraction layer so that it is placed at a floating potential, the minority carriers are not injected from the collector layer into the semiconductor region so that the "off" operation can be completed for a short time enough to sweep only the carriers existing at the initial time of the "off" operation. For this reason, in the IGBT according to the present invention, irrespectively of the lateral structure, the "off" operation time can be shortened half or less as long as in the prior art thereby to extend the usable frequency region to a high frequency region.

(b) When the IGBT is to be incorporated in the integrated circuit device, the "off" operation time can be sufficiently shortened without introducing lifetime killers unlike the prior art. Therefore, any possible adverse effect of the lifetime killers on the circuits related to the IGBT within the integrated circuit device can be eliminated. Further, using high integration technology, the IGBT can be formed in a miniaturized pattern to shorten its "off" operation, thereby improving the frequency characteristic.

(c) The emitter side portion and collector side portion of the IGBT can be formed in a semiconductor region in a common step. Namely, using planar technique, both portions have only to be formed in the semiconductor region from its same surface. Further, almost all the fabrication steps can be shared with an ordinary MOS integration circuit. Thus, the integrated circuit device in which the IGBTs are incorporated with the related circuits in a less number of steps can be provided at low cost, thus enlarging the application field of the IGBT.

What is claimed is:

1. A lateral structure insulated gate bipolar transistor with an emitter side portion and a collector side portion disposed apart from each other by a predetermined distance on the same surface side of a semiconductor region., the semiconductor region having a first conductivity type, comprising:

a main gate electrode located in the emitter side portion for controlling injection of majority carriers of the first conductivity type into the semiconductor region;

a collector layer of a second conductivity type diffused into the semiconductor region in the collector side portion;

a carrier extraction layer of the first conductivity type diffused into the semiconductor region in the collector side portion but not adjacent to the collector layer;

a field effect transistor portion, having an auxiliary gate electrode, interconnecting the collector layer and the carrier extraction layer; and a collector terminal electrically connected to the carrier extraction layer, wherein while the field effect transistor portion is controlled by the auxiliary gate electrode, during an on state when the collector layer is connected to the carrier extraction layer, majority carriers of the second conductivity type are caused to flow from the semiconductor region to the carrier extraction layer and minority carriers are injected from the collector layer into the semiconductor layer, and during an off state when the collector layer is separated from the carrier extraction layer, the majority carriers are extracted from the semiconductor region into the carrier extraction layer and the minority carriers are extracted from the semiconductor region into the emitter side portion.

2. An insulated gate bipolar transistor according to claim 1, wherein the field effect transistor portion comprises:

a diffused well layer of the second conductivity type surrounding the collector layer and having a dopant concentration less than a dopant concentration of the collector layer and connected to the same potential as that of the collector layer;

a source layer of the first conductivity type diffused in surfaces of the diffused well layer and the collector layer in a pattern partially overlapping the diffused well layer and the collector layer, and the auxiliary gate electrode covering a surface of the diffused well layer from the source layer to the carrier extraction layer; and an electrode film, not connected to any voltage source, interconnecting surfaces of the collector layer and the source layer.

3. An insulated gate bipolar transistor according to claim 1, further comprising:

a main gate operating power source on the emitter side portion for supplying a main control voltage for controlling the main gate electrode;

an auxiliary gate operating power source on the collector side portion for supplying an auxiliary control voltage for controlling the auxiliary gate electrode; and a level shift circuit for maintaining the main control voltage and the auxiliary control voltage in opposite states so that the main gate and the auxiliary gate are controlled correlatively to each other.

4. A lateral structure insulated gate bipolar transistor with an emitter region and a collector region on the same surface side of a semiconductor region, the semiconductor region having a first conductivity type, comprising:

a main gate electrode located in the emitter region for controlling injection of majority carriers of the first conductivity type into the semiconductor region;

a collector layer of a second conductivity type diffused into the semiconductor region in the collector region;

a carrier extraction layer of the first conductivity type diffused into the semiconductor region in the collector region;

a field effect transistor region having a diffused well layer of the second conductivity type surrounding the collector layer and having a dopant concentration less than a dopant concentration of the collector layer and connected to the same potential as that of the collector layer, and further having an auxiliary gate electrode for connecting the collector layer and the carrier extraction layer in the on state of the bipolar transistor to cause the flow of majority carriers of the second conductivity type from the semiconductor region into the carrier extraction layer and to cause the injection of minority carriers from the collector layer into the semiconductor region, the auxiliary gate electrode disconnects the collector layer and the carrier extraction layer during an off state of the bipolar transistor to cause the extraction of the majority carriers from the semiconductor region into the carrier extraction layer and to cause the extraction of the minority carriers from the semiconductor region into the emitter side portion; and a collector terminal electrically connected to the carrier extraction layer.

* * * * *

UNITED STATES PATENT AND TRADEMARK OFFICE
CERTIFICATE OF CORRECTION

PATENT NO. : 5,485,023
DATED : January 16, 1996
INVENTOR(S) : Hitoshi SUMIDA

It is certified that error appears in the above-indentified patent and that said Letters Patent is hereby corrected as shown below:

Claim 1, column 12, line 17, "region.," should read --region,--.

Signed and Sealed this

Nineteenth Day of November, 1996

Attest:

BRUCE LEHMAN

Attesting Officer

Commissioner of Patents and Trademarks